(12) United States Patent
Nad et al.

(10) Patent No.: US 11,445,616 B2
(45) Date of Patent: Sep. 13, 2022

(54) INTERFACIAL LAYER FOR HIGH RESOLUTION LITHOGRAPHY (HRL) AND HIGH SPEED INPUT/OUTPUT (IO OR I/O) ARCHITECTURES

(71) Applicant: Intel Corporation, Santa Clara, CA (US)

(72) Inventors: Suddhasattwa Nad, Chandler, AZ (US); Rahul Manepalli, Chandler, AZ (US); Marcel Wall, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 1002 days.

(21) Appl. No.: 15/954,040

(22) Filed: Apr. 16, 2018

(65) Prior Publication Data

US 2019/0320537 A1   Oct. 17, 2019

(51) Int. Cl.
*H05K 3/38* (2006.01)
*H01L 21/027* (2006.01)
(Continued)

(52) U.S. Cl.
CPC ......... *H05K 3/386* (2013.01); *H01L 21/0273* (2013.01); *H01L 21/4846* (2013.01); *H01L 23/49894* (2013.01); *H05K 1/0353* (2013.01); *H01L 24/16* (2013.01); *H01L 2224/16225* (2013.01)

(58) Field of Classification Search
CPC . B21B 15/04; H01L 21/0273; H01L 21/4846; H01L 23/49894; H01L 24/16; H01L 2224/16225; H05K 1/0353; H05K 3/386; B32B 15/04
See application file for complete search history.

(56) References Cited

U.S. PATENT DOCUMENTS

| | | | | |
|---|---|---|---|---|
| 5,266,385 A | * | 11/1993 | Ishii | .......... C08K 5/45 428/209 |
| 2004/0185600 A1 | * | 9/2004 | Kagan | ................. H01L 51/0545 438/99 |

(Continued)

OTHER PUBLICATIONS

Britannica, Chemical compound, at https://www.britannica.com/print/article/108614, pp. 20-23 (2020).*

*Primary Examiner* — Kregg T Brooks
(74) *Attorney, Agent, or Firm* — Schwabe, Williamson & Wyatt, P.C.

(57) ABSTRACT

Embodiments described herein are directed to interfacial layers and techniques of forming such interfacial layers. An interfacial layer having one or more light absorbing molecules is on a metal layer. The light absorbing molecule(s) may comprise a moiety exhibiting light absorbing properties. The interfacial layer can assist with improving adhesion of a resist layer to the metal layer and with improving use of one or more lithography techniques to fabricate interconnects and/or features using the resist and metal layers for a package substrate, a semiconductor package, or a PCB. For one embodiment, the interfacial layer includes, but is not limited to, an organic interfacial layer. Examples of organic interfacial layers include, but are not limited to, self-assembled monolayers (SAMs), constructs and/or variations of SAMs, organic adhesion promotor moieties, and non-adhesion promoter moieties.

12 Claims, 5 Drawing Sheets

(51) Int. Cl.
 H01L 21/48 (2006.01)
 H05K 1/03 (2006.01)
 H01L 23/498 (2006.01)
 H01L 23/00 (2006.01)

(56) References Cited

U.S. PATENT DOCUMENTS

| | | | |
|---|---|---|---|
| 2006/0249202 A1* | 11/2006 | Yoo | H01L 51/4246 |
| | | | 136/263 |
| 2007/0232077 A1* | 10/2007 | Setta | H01L 21/0271 |
| | | | 257/E21.024 |
| 2008/0175812 A1* | 7/2008 | Seabrook | A01N 65/08 |
| | | | 424/78.09 |

* cited by examiner

FIG. 1A
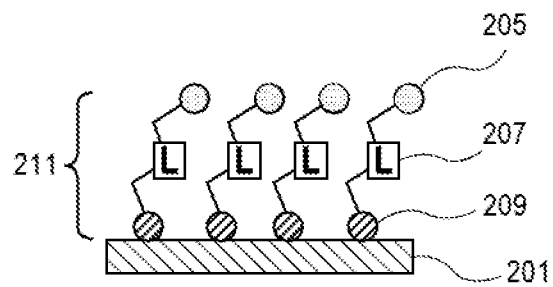
FIG. 1B
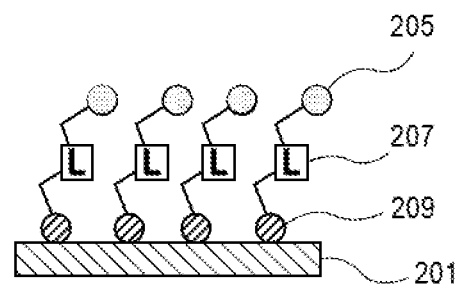
FIG. 1C
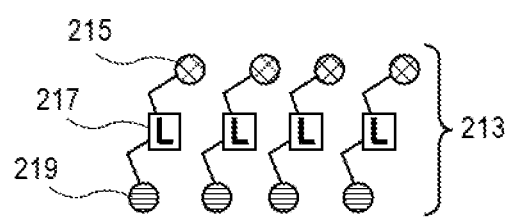
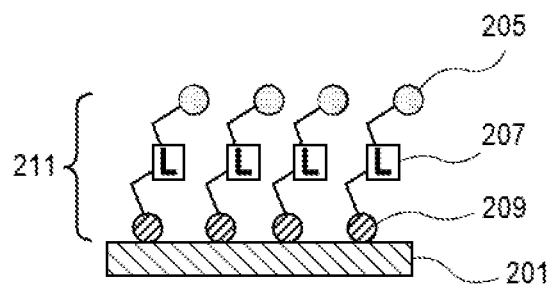
FIG. 1D

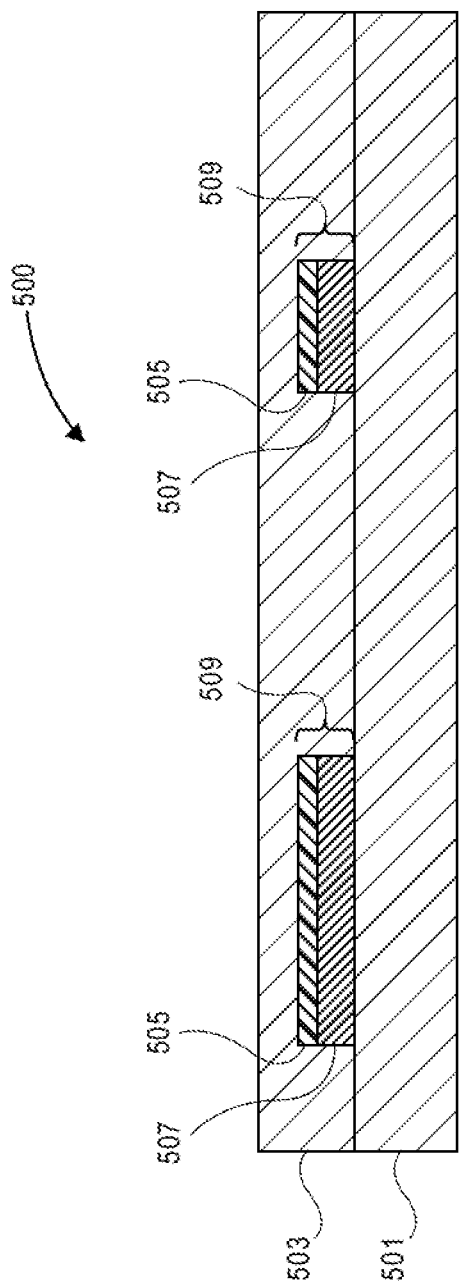
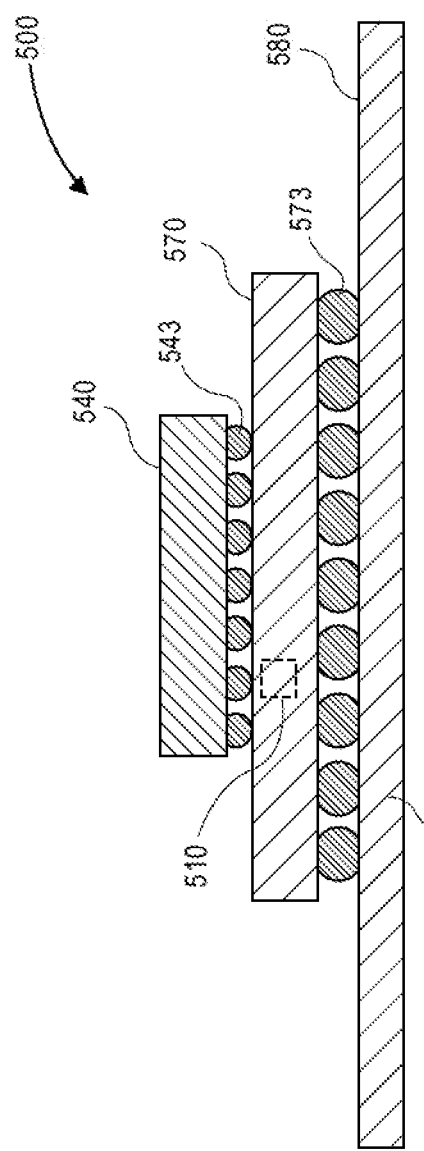

INTERFACIAL LAYER FOR HIGH RESOLUTION LITHOGRAPHY (HRL) AND HIGH SPEED INPUT/OUTPUT (IO OR I/O) ARCHITECTURES

BACKGROUND

Field

Embodiments described herein generally relate to package substrates, semiconductor packages, or printed circuit boards ("PCB"). More particularly, but not exclusively, embodiments described herein relate to an interfacial layer that is on or part of a package substrate, a semiconductor package, and/or a PCB.

Background Information

A package substrate, a semiconductor package, or a PCB may comprise one or more layers, where at least one of the layers comprises one or more features formed therein or thereon. A semiconductor package may comprise a package substrate and one or more semiconductor dies (which may also be referred to as integrated circuits (ICs) herein) on the package substrate. Also, a semiconductor package may be on a PCB.

Examples of layers include, but are not limited to, one or more of: (i) a metal layer; (ii) a dielectric layer; (iii) a resist layer; (iv) any other layer known in the art of semiconductor packaging, the art of semiconductor fabrication, or the art of PCB fabrication ("the art"); and (iv) a combination thereof. For brevity, "a layer" and its variations refer to a layer of a package substrate, a layer of a semiconductor package, a layer of a PCB, or any combination thereof. There can be any number of layers in a package substrate, a semiconductor package, a PCB, or a combination thereof.

Examples of features formed in or on one or more layers include, but are not limited to, active electronic devices (e.g., transistors, rectifiers, any other active electronic device known in the art, any combination thereof, etc.), passive electronic devices (e.g., resistors, capacitors, inductors, transformers, diodes, any other passive electronic device known in the art, any combination thereof, etc.), and isolation structures. As used herein, an "isolation structure" comprises a first feature used to isolate a second feature and a third feature that are adjacent to each other. An isolation structure can minimize or prevent electric current leakage and/or latch-up between the two other adjacent features. Examples of isolation structures include, but are not limited to, a trench (e.g., a three dimensional (3D) trench, a two dimensional (2D) trench, a shallow trench, a deep trench, any other trench known in the art, etc.) and a locally oxidized silicon structure formed using a local oxidation of silicon (LOCOS) technique.

One or more layers may comprise at least one interconnect for coupling (e.g., electrical coupling, optical coupling, etc.) two or more features formed in or on the layer(s). An interconnect enables signal communication between two or more features. Examples of interconnects include, but are not limited to, conductive lines (which may also be referred to as traces herein), vertical interconnect accesses (vias), pads, conductive structures (e.g., conductive pillars, conductive bumps, etc.), and any combination thereof.

As demand for electronic devices increases, semiconductor packaging, semiconductor fabrication, and/or PCB fabrication technologies face pressures to optimize package substrates, semiconductor packages, and/or PCBs. Some of these pressures include, but are not limited to, increasing interconnect bandwidth or speed of interconnects and increasing the achievable input/output (I/O or IO) density per millimeter per layer (IO/mm/layer). Increasing the IO/mm/layer can assist with increasing the number of interconnects and/or features formed in or on one or more layers. With specific regard to interconnects, increasing the number of interconnects can assist with improving signal communication between features formed in or on one or more layers.

Decreasing the fine line spacing (FLS) of interconnects and/or features can assist with increasing interconnect bandwidth or speed and/or increasing the achievable IO/mm/layer. As used herein, the terms "fine line spacing", "FLS", and their variations refer to fine line spacing of patterned lines used in semiconductor and/or electronic packaging manufacturing. Currently, semiconductor packaging, semiconductor fabrication, and/or PCB fabrication technologies face pressures to decrease the FLS. For a non-limiting example, such pressures may include decreasing FLS from 9/12 micrometers (microns or μm) towards 2/2 μm. One technique with potential to minimize or solve these pressures is a high resolution lithography (HRL) technique, which comprises using a beam of electrons to fabricate interconnects and/or features. HRL includes, but is not limited to, using a beam of electrons (e.g., an high intensity exposure beam (HIEB), etc.) to draw custom shapes on a surface covered with a resist material. The resist material is an electron-sensitive material. This drawing process is sometimes known as exposing. The beam of electrons modifies the solubility of the resist material, which in turn enables selective removal of either the exposed or non-exposed regions of the resist material by immersing it in a solvent. The solvent is sometimes known as a developer. The wavelengths of the electron beam used for patterning include, but are not limited to, wavelengths of approximately 13.4 nanometers (nm), wavelengths that are less than or equal to 450 nm, and wavelengths that are selected from a range of 315 nm to 380 nm. In this way, HRL allows for creating very small structures in the resist material that can subsequently be transferred to a substrate material, often by etching.

One drawback of using an HRL technique to fabricate interconnects and/or features is the creation of unwanted surface reflection off one or more layers exposed to a beam of electrons (e.g., an HIEB, etc.). For example, processing layer(s) comprising resist materials may require exposing the resist materials to the beam of electrons, which can, in some scenarios, include light characterized by shorter wavelengths (when compared to light characterized by relatively longer wavelengths used in older lithography techniques). For this example, maintaining a fidelity of the HIEB during the exposure operation may be required to define dense fine line space features. However, maintaining the fidelity can result in unwanted surface reflection of the HIEB off a resist layer that is close to a metal layer. A reflected exposure beam also retains its fidelity, however, this fidelity is unwanted due to its effect of decreasing the sharpness of features, especially when those features are close to the metal surface by curing the resist materials.

The unwanted surface reflection described above can negatively affect an ability of an beam of electrons to define dense fine line space features close to a metal layer (e.g., a seed layer, etc.). This negative effect can be further magnified when a smooth metal layer is formed on a smooth dielectric layer during fabrication of low loss high speed interconnects. The negative effect can be prevalent when the metal layer is a smooth metal layer and/or the dielectric layer is a smooth dielectric layer.

Several techniques aimed at minimizing or eliminating the negative effect caused by the unwanted surface reflection described above have been proposed. One proposal includes roughening (e.g., mechanically roughening, chemically roughing, etc.) the metal layer to improve adherence between the metal layer and another layer (e.g., a dielectric layer, a resist layer, etc.). Roughening the metal layer (e.g., a seed layer, etc.) requires a thickness of the metal layer to be large so that effective roughness on a continuous conductor surface. This requires thick electroless or physical vapor deposition/chemical vapor deposition (PVD/CVD)", which can limit manufacturing options and be a showstopper for most packaging architectures. Also, thick metal layers can limit the benefits of HRL due to the thick seed removal requirements.

Another proposal includes applying an organic adhesion promoter (OAP) on a metal layer to improve adhesion of the metal layer to another layer (e.g., a dielectric layer, a resist layer, etc.). Current OAP formulations, however, have limited properties, which can in turn limit their use in HRL. Despite the presence of these proposals, fabricating interconnects and/or features in or on one or more layers remains suboptimal.

BRIEF DESCRIPTION OF THE DRAWINGS

Embodiments described herein are illustrated by way of example and not limitation in the figures of the accompanying drawings, in which like references indicate similar features. Furthermore, in the figures, some conventional details have been omitted so as not to obscure from the inventive concepts described herein.

FIGS. 1A-1E illustrate a method of forming an interfacial layer on a metal layer in accordance with one or more embodiments.

FIG. 4 illustrates a cross-sectional illustration of a package substrate, according to an embodiment.

FIG. 5 illustrates a cross-sectional illustration of a packaged system, according to an embodiment.

DETAILED DESCRIPTION

Figure 1E:
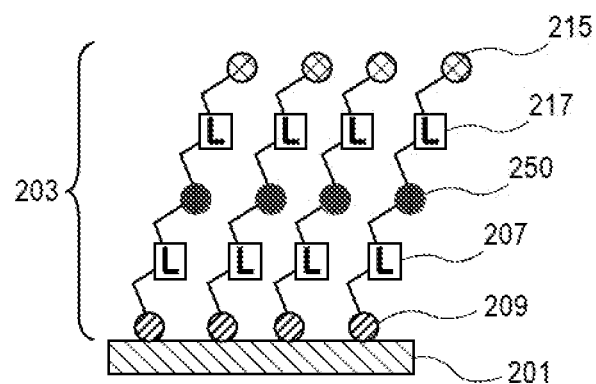
Figure 2A:
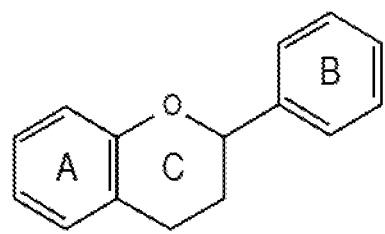
FIGS. 2A-2D illustrate classes of compounds that exhibit light absorbing properties. One or more of the classes of compounds may be included in an interfacial layer, according to one or more embodiments.
Figure 2B:
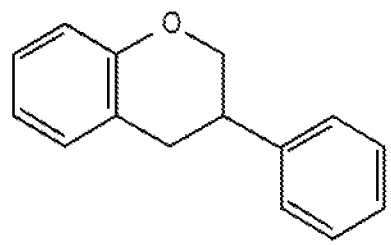
Figure 2C:
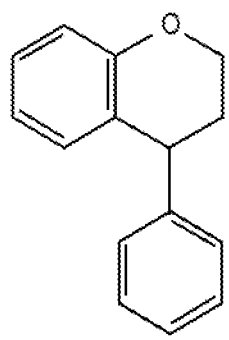
Figure 2D:
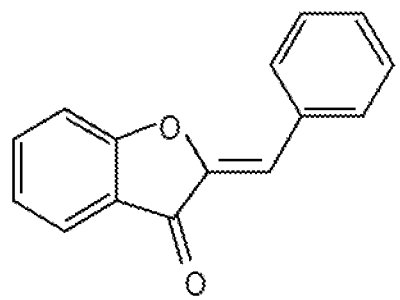

Embodiments described herein provide techniques for forming an interfacial layer on a metal layer to assist with improving adhesion of a resist layer to the metal layer and with improving use of one or more lithography techniques (e.g., an HRL, any other lithography technique known in the art, any combination of lithography techniques known in the art, etc.) to fabricate interconnects and/or features using the resist and metal layers for a package substrate, a semiconductor package, or a PCB. For one embodiment, the interfacial layer includes, but is not limited to, an organic interfacial layer. Examples of organic interfacial layers include, but are not limited to, self-assembled monolayers (SAMs), constructs and/or variations of SAMs, organic adhesion promotor moieties, and non-adhesion promoter moieties. The interfacial layer can be in film form and/or any other suitable form known in the art. For one embodiment, when the interfacial layer comprises an SAM, the SAM is formed as a product of a reaction that involves two types of bi-functional molecules. A first bi-functional molecule (M1) exhibits a first set of one or more functionalities and a second bi-functional molecule (M2) exhibits a second set of one or more functionalities. M1's one or more functionalities may differ from M2's one or more functionalities. For one embodiment, at least one of the bi-functional molecules includes a moiety. This moiety can be formed from one or more molecules having light absorbing properties. For one embodiment, the moiety having the light absorbing properties is added as part of a backbone of the first bi-functional molecule (M1) and/or a backbone of the second bi-functional molecule (M2). This addition can assist with improving absorption of impinging low wavelength light close to a surface of a metal layer (e.g., a seed layer, a copper seed layer, etc.). Embodiments of the interfacial layer described herein (which exhibit light absorbing properties) can assist with reducing unwanted surface reflection that may occur when a light source (e.g., an HIEB, any other suitable beam of electrons, any combination thereof, etc.) is used to expose a resist layer on a metal layer. In this way, embodiments of the interfacial layer can assist with fabricating interconnects (e.g., metal traces, etc.) in a simple, cost-effective manner.

Following fabrication of the interconnects (e.g., metal traces, etc.), additional processes and/or operations may be performed to fabricate a package substrate, a semiconductor package, or a PCB. These additional processing operations are not described herein to avoid obscuring or convoluting one or more of the invention concepts described herein.

Several advantages are provided by the embodiments described herein. One advantage of the embodiments described herein is that the interfacial layer can assist with minimizing or eliminating unwanted surface reflection of a light source used in lithography (e.g., an HIEB, any other suitable beam of electrons, any combination thereof, etc.) off a resist layer, which can in turn minimize or eliminate inhibition of the light source's ability to define dense fine line space features caused by the unwanted surface reflection. Minimizing or eliminating inhibition of the light source's ability to define dense fine line space features can assist with decreasing the fine line spacing (FLS) of interconnects formed in or on one or more layers, which can in turn assist with increasing interconnect bandwidth or speed and/or increasing the achievable IO/mm/layer of the package substrate. Increasing interconnect bandwidth or speed can assist with improving a performance (e.g., electrical performance, connectivity capabilities, increased processing speeds, etc.) of a package substrate, a semiconductor package, or a PCB. Consequently, improving a performance of a package substrate, a semiconductor conductor package, or a PCB can, among others, assist with improving a performance of an electronic device comprising the package substrate, the semiconductor conductor package, or the PCB. Increasing the achievable IO/mm/layer can assist with reducing a thickness (e.g., a z-height, etc.) of a package substrate, a semiconductor conductor package, or a PCB. Consequently, increasing the achievable IO/mm/layer of the package substrate, the semiconductor conductor package, or the PCB can, among others, assist with miniaturizing an electronic device comprising the package substrate, the semiconductor conductor package, or the PCB.

FIG. 1A-1E, which illustrate a method of forming an interfacial layer 203 on a metal layer 201 in accordance with one or more embodiments. The method shown in FIGS. 1A-1E omits one or more components and/or structures known in the art for simplicity and to avoid obscuring and/or convoluting one or more of the inventive concepts described herein.

For one embodiment, the interfacial layer 203 includes, but is not limited to, an organic interfacial layer. The organic interfacial layer can be in film form and/or any other suitable form known in the art. Examples of organic interfacial layers include, but are not limited to, self-assembled monolayers (SAMs), constructs and/or variations of SAMs, organic adhesion promotor moieties, and non-adhesion promoter moieties. For one specific embodiment shown in FIGS. 1A-1E, the interfacial layer comprises an SAM. Even though the specific embodiment shown in FIGS. 1A-1E is directed to an interfacial layer comprising an SAM. It is to be appreciated that the embodiments described herein are applicable to any type of interfacial layer or combination of interfacial layers known in the art. The specific embodiment shown in FIGS. 1A-1E is directed to an interfacial layer comprising an SAM is merely an illustrative non-limiting example. Furthermore, this paragraph is applicable to one or more embodiments described below in connection with FIGS. 1A-6.

With specific regard now to FIG. 1A, a metal layer 201 is shown. The metal layer 201 can be included in a package substrate, a semiconductor package, and/or a PCB. For one embodiment, the metal layer 201 is processed to include a dielectric polymer interface (DPI) on a top side of the metal layer 201. Any suitable technique known in the art for applying or depositing a DPI on a metal layer may be used.

Moving on to FIG. 1B, a first bi-functional molecule (M1) 211, which exhibits a set of one or more functionalities, is attached to the DPI on the metal layer 201. As used herein, a "bi-functional molecule" includes, but is not limited to, one or more of: (i) a molecule comprising one functional group (referred to herein as a "head group") which is to anchor to a surface of a layer (e.g., a metal layer, a DPI on a metal layer, etc.); (ii) another functional group (referred to herein as a "terminal group") that is to provide a reaction site, and (iii) a moiety (also referred to herein as a "chain" or "tail") which extends between the head group and the terminal group. For example, the first bi-functional molecule (M1) 211 comprises a head group (R1) 209, a tail group (R2 or R3) 205, and a moiety (L1) 207. As shown in FIG. 1B, the moiety (L1) 207 extends between the head group (R1) 209 and the tail group (R2 or R3) 205.

The head group (R1) 209 may include any of a variety of groups to facilitate a reaction that assists with attaching the first bi-functional molecule (M1) 211 to a surface of the metal layer 201 (e.g., the DPI on the metal layer 201, etc.). The first bi-functional molecule (M1) 211 may adhere to such a surface through adsorption (e.g., chemisorption, physisorption, etc.). The head group (R1) 209 may include any of a variety of functional groups comprising or at least one oxygen atom, at least one sulfur atom, or at least one nitrogen atom. Such a chemistry of the head group (R1) 209 may promote adsorption or other attachment of the bi-functional molecule (M1) 211 on the metal layer 201. For example, The head group (R1) 209 may include, or be a derivative of, any of a variety of disulfide groups of the form (S—S—Ra), where Ra is a hydrogen atom or an organic component of the head group (R1) 209. Alternatively, the head group (R1) 209 may include a thiol, for example.

For an embodiment, the head group (R1) 209 includes or is a derivative of an amine group such as any of a variety of primary, secondary, tertiary or cyclic amines. Some examples of such a head group (R1) 209 includes various derivatives of aniline and 2-aminopentane. The head group (R1) 209 may alternatively include, or be a derivative of, an azo group or any of a variety of azole groups, such as imidazole, pyrazole, triazole, tertrazole. For example, the head group (R1) 209 may include a cyclic ring comprising a carbon atom by which the moiety (L1) 207 bonds to the head group (R1) 209. For this example, the first bi-functional molecule (M1) 211 includes a substituted imidazole. For other embodiments, the head group (R1) 209 includes a pyridine derivative. The head group (R1) 209 may alternatively include or be a derivative of an amide such as any of a variety of organic amide groups. For some embodiments, the head group (R1) 209 includes any of a variety of cyanoacrylate derivatives. For example, the first bi-functional molecule (M1) 211 may include a derivative of 2-octylcyanoacrylate or isobutyl cynoacrylate. For this example, the moiety (L1) 207 comprises an octyl or isobutyl aliphatic ester chain.

As shown in FIG. 1B, the bi-functional molecule (M1) 211 includes a tail group (R2 or R3) 205. For some embodiments, the tail group (R2 or R3) 205 may include, or be a derivative of, an acid such as any of a variety of organic acids which, for example, include a carboxyl (COOH) group. The tail group (R2 or R3) 205 may alternatively include, or be a derivative of, an acid anhydride such as any of a variety of organic acid anhydrides. In other embodiments, tail group (R2 or R3) 205 may include, or be a derivative of, any of a variety of thioanhydrides such as benzoic thioanhydride. The tail group (R2 or R3) 205 may alternatively include, or be a derivative of, an aliphatic alcohol such as any of a variety of organic aliphatic alcohols. In still other embodiments, the tail group (R2 or R3) 205 may include, or be a derivative of, an aromatic alcohol such as any of a variety of organic aromatic alcohols. The tail group (R2 or R3) 205 may alternatively include, or be a derivative of, an unsaturated hydrocarbon such as any of a variety of aliphatic or aromatic chain molecules which, for example, comprise an alkenyl moiety (such as a vinyl group) or an alkyne moiety.

The head group (R1) 209 and tail group (R2 or R3) 205 may be substantially non-reactive with each other, thereby mitigating self-polymerization and three dimensional (3D) stack-ups that could assist with inhibiting adhesion of the first bi-functional molecule (M1) 211 to a surface of the metal layer 201 (e.g., a DPI on the metal layer 201, etc.). For one embodiment, a functional group combination of the head group (R1) 209, tail group (R2 or R3) 205, and the moiety (L1) 207 used to form the first bi-functional molecule (M1) 211 includes a thiol of head group (R1) 209 and an organic alcohol of tail group (R2 or R3) 205. For example, a structure of the first bi-functional molecule (M1) 211 is HS-X1-OH. For this example, the head group (R1) 209 comprises an anion (e.g., HS, etc.), the moiety (L1) 207 comprises X1, and the tail group (R2 or R3) 205 comprises an alcohol group (e.g., OH, etc.). For one embodiment, any excess first bi-functional molecule (M1) 211 may be washed away prior to the introduction of a second bi-functional molecule (M2) 213, which is described below in connection with at least FIGS. 1D-1E. In this way, an occurrence of self-polymerization and/or 3D stack-ups can be reduced or eliminated.

With regard now to FIG. 1C, which may be an optional operation in the method used to form the interfacial layer 203. As shown in FIG. 1C, the tail group (R2 or R3) 205 may comprise a first tail group R2 at least upon attachment of the head group (R1) 209 to the DPI on the metal layer 201.

Although some embodiments are not limited in this regard, the first tail group R2 of the tail group (R2 or R3) 205 may be subsequently reacted to produce a second, modified tail group R3 of the tail group (R2 or R3) 205. For example, a first reaction occurs prior to a second reaction of the bi-functional molecules (M1) 205 with a second bi-functional molecule (M2) 213, which is described below in connection with at least FIGS. 1D-1E. For this example, at least one of the reagents used in the first reaction is the first tail group R2 of the tail group (R2 or R3) 205 and a product of the first reaction is the second, modified tail group R3 of the tail group (R2 or R3) 205. Also, and for this example, the first reaction results in acylation, esterification, or amide bond formation that removes, replaces, or otherwise changes at least some of the first tail group R2 of the tail group (R2 or R3) 205. For example, the first tail group R2 of the tail group (R2 or R3) 205 may include or be a derivative of, an alcohol, an acid, or an acid anhydride, where the second, modified tail group R3 of the tail group (R2 or R3) 205 results from an esterification of the first tail group R2 of the tail group (R2 or R3) 205. For one or more embodiments, the first reaction that produces the second, modified tail group R3 of the tail group (R2 or R3) 205 changes an acid anhydride or a thioanhydride of the first tail group R2 of the tail group (R2 or R3) 205. It is to be appreciated that one or more embodiments described herein use the first tail group R2 of the tail group (R2 or R3) 205 without subsequent reaction to produce the second, modified tail group R3 of the tail group (R2 or R3) 205. Thus, for these embodiments, the first bi-functional molecule (M1) 211 comprises the head group (R1) 209, the first tail group R2 of the tail group (R2 or R3) 205, and the moiety (L1) 207. Other embodiments include a reaction to produce the second, modified tail group R3 of the tail group (R2 or R3) 205. Thus, for these other embodiments, the first bi-functional molecule (M1) 211 comprises the head group (R1) 209, the second tail group R2 of the tail group (R2 or R3) 205, and the moiety (L1) 207.

Referring now to FIG. 1D, a second bi-functional molecule (M2) 213 may be introduced to react with the first bi-functional molecule (M1) 211. For one embodiment, the second bi-functional molecule (M2) 213 comprises one or more of a tail group (R4) 215, a head group (R5) 219, and a moiety (L2) 217. The example shown in FIG. 1D illustrates the second bi-functional molecule (M2) 213 as comprising a tail group (R4) 215, a head group (R5) 219, and a moiety (L2) 217. The tail group (R4) 215 may include, or be a derivative of, an amine such as any of those described herein with reference to the head group (R1) 209. Alternatively, the tail group (R4) 215 may include a thiol, for example. In some embodiments, the tail group (R4) 215 includes, or is a derivative of, a disulfide such as any of those described herein with reference to the head group (R1) 209. The tail group (R4) 215 may alternatively include, or be a derivative of, an acid anhydride or an alcohol such as any of those described herein with reference to the tail group (R2 or R3) 205. The head group (R5) 219 may include, or be a derivative of, an amine, an azole or an imide such as any of those described herein with reference to the head group (R1) 209. In some embodiments, head group (R5) 219 includes a cyanoacrylate derivative such as any of those described herein with reference to the head group (R1) 209. Since the head group (R1) 209 and head group (R5) 219 are separated into two different molecules, polymerization may be mitigated, enabling the use of more reactive attachment pathways including a thiol, for example.

For one embodiment, the first bi-functional molecule (M1) 211 and/or the second bi-functional molecule (M2) 213 may have some (e.g., two, etc.) functional groups that are reactive. In this way, a wider variety and/or higher reactivity of an end group combination comprising the tail group (R2 or R3) 205 and tail group (R4) 215. For some embodiments, the head group (R5) 219 and the tail group (R4) 215 are substantially non-reactive with each other. For example, the head group (R5) 219 and the tail group (R4) 215 may each include a respective amine (e.g., —NH$_2$, etc.), a respective carboxyl group (e.g., COOH, etc.), a respective alcohol group (e.g., OH, etc.), or any other group that is not reactive with its own group type.

For an embodiment, one or more of the moiety (L1) 207 and moiety (L2) 217 includes a short chain of atoms (e.g., carbon atoms, etc.). For another embodiment, one or more of the moiety (L1) 207 and moiety (L2) 217 includes a long chain of atoms. The short and/or long chain of atoms can be resistive of chain folding. As used herein, the term "short chain" and its variations refers to a chain of up to ten atoms (e.g., carbon atoms, etc.). Such a short chain may comprise a derivative, a methyl group, ethyl group, octyl group, or decyl group, or any of a variety of hydrocarbons. For example, the short chain includes or is a derivative of an alkyl chain or an alkyne chain. In some embodiments, one or more of the moiety (L1) 207 and moiety (L2) 217 includes or is a derivative of an allyl chain.

Moving on to FIG. 1E, the first bi-functional molecule (M1) 211 and the second bi-functional molecule (M2) 213 may be brought in contact with one another to facilitate a reaction thereof. An intermediate moiety (R6) 250 produced by such reaction may form the resulting interfacial layer 203, which comprises one or more atoms of the first bi-functional molecule (M1) 211 and/or the second bi-functional molecule (M2) 213. The tail group (R2 or R3) 205 may be susceptible to reaction with the head group (R5) 219. For brevity, such groups are referred to herein as being "complementary" to one another. A reaction between the tail group (R2 or R3) 205 may be susceptible to reaction with the head group (R5) 219 to form an intermediate moiety (R6) 250. For one embodiment, formation of the intermediate moiety (R6) 250 may include an esterification reaction between an alcohol and an acid (or an acid anhydride), an amide bond formation between an acid (or an acid anhydride) and an amine, a cyclization reaction or the like.

For one embodiment, one or more of the moiety (L1) 207 and moiety (L2) 217 may comprise a moiety exhibiting light absorbing properties, which may also be referred to herein as a light absorbing moiety. A light absorbing moiety comprises at least one molecule that exhibits light absorbing properties. The light absorbing moiety may be functionalized using any number of points (e.g., a single-point functionalization, a double point functionalization, etc.). When one or more of the moiety (L1) 207 and moiety (L2) 217 comprises a light absorbing moiety, a reaction of the first bi-functional molecule (M1) 211 and the second bi-functional molecule (M2) 213 produces the interfacial layer 203, which comprises a light absorbing interface that can assist with enhancing adhesion between layers (e.g., a resist layer to the metal layer 201, etc.).

One or more of the exemplary embodiments described herein may present each of the first bi-functional molecule (M1) 211 and/or the second bi-functional molecule (M2) 213 as including a moiety exhibiting light absorbing properties. Other embodiments, however, are not so limited. For example, only one selected from a group consisting of the first bi-functional molecule (M1) 211 and the second bi-functional molecule (M2) 213 includes a moiety exhibiting light absorbing properties. For another example, each of the first bi-functional molecule (M1) 211 and the second bi-functional molecule (M2) 213 includes a moiety exhibiting light absorbing properties. It is to be appreciated that both of the first bi-functional molecule (M1) 211 and the second bi-functional molecule (M2) 213 are not required to include a moiety exhibiting light absorbing properties. The description in this paragraph applies to one or more embodiments described herein in connection with at least one of FIGS. 1A-6.

Moving on to FIGS. 2A-2D, which illustrate classes of compounds A-D that exhibit light absorbing properties. One or more of the classes of compounds A-D may be included in one or more of the moiety (L1) 207 and moiety (L2) 217, which are described above in connection with FIGS. 1A-1E. The compounds A-D shown in FIG. 2A-2D are merely exemplary and other compounds that exhibit light absorbing properties may be used.

Some electronic packaging technologies utilize 436 nm (g-line) and 405 nm (h-line) exposure wavelengths, while other electronic packaging technologies utilize 365 nm (i-line) exposure wavelengths that extend exposure resolutions in order to achieve interconnects and/or features in the sub-micron region. In order to assist with HRL that can utilize exposure wavelengths that are equal to or less than 365 nm (i-line) exposure wavelengths without surface reflection, one or more of the moiety (L1) 207 and moiety (L2) 217 may be formed from a molecule comprising light-absorbing properties. Examples of a molecule comprising light-absorbing properties include, but are not limited to, one or more of the following: (i) a flavonoid (which is molecular structure A in FIG. 2A); (ii) an isoflavanoid (which is molecular structure B in FIG. 2B); (iii) a neoflavanoid (which is molecular structure C in FIG. 2C); and (iv) an aurone (which is molecular structure D in FIG. 2D).

Integrating molecules having light absorbing properties into one or more of the moiety (L1) 207 and moiety (L2) 217 can assist with forming the interfacial layer 203 described above in connection with FIGS. 1A-1E. Due, at least in part, to light absorbing properties molecules included in one or more of the moiety (L1) 207 and moiety (L2) 217, the interfacial layer 203 can assist with reducing unwanted surface reflection of a light source (e.g., an HIEB, etc.) off of the resist layer that is adhered to the metal layer 201 and with enhancing adhesion of the resist layer to the metal layer 201.

For one embodiment, a moiety comprising one or more molecules having light absorbing properties (e.g., the moiety (L1) 217, moiety (L2) 217, a combination thereof, etc.) is attached to a backbone of one or more of the first bi-functional molecule (M1) 211 and the second bi-functional molecule (M2) 213. For a specific embodiment, attachment of a moiety comprising one or more molecules having light absorbing properties to a backbone of a bi-functional molecule is performed using carbon atoms. Attachment of a moiety comprising one or more molecules having light absorbing properties to a backbone of a bi-functional molecule that is performed using carbon atoms can be performed using a single point of attachment (single carbon atom functionalization), a double point of attachment (two carbon atom functionalization), or any other suitable number of points of attachments known in the art for attaching atoms, molecules, or compounds to backbones. For example, attachment of flavonoid-based structures or derivatives can be performed at C5-C8 in Ring A and/or C2'-6' in Ring B. For another example, attachment of aurones can be performed at C4-C7 in Ring A and/or C2'-6' in Ring B.

Figure 3:
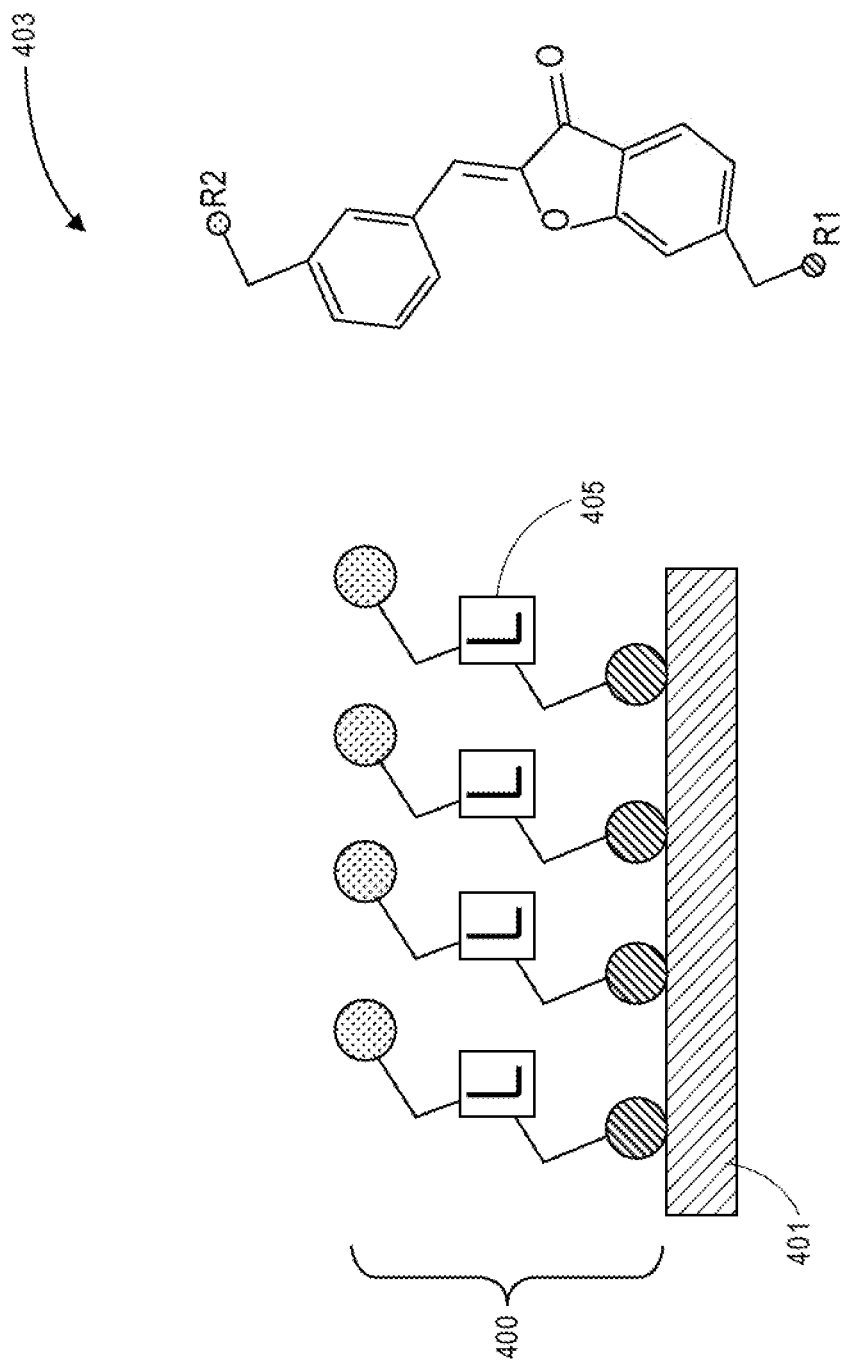
FIG. 3 illustrates a bi-functional molecule attached to a metal layer 401 and a structural formula the bi-functional molecule, according to an embodiment.

With specific regard now to FIG. 3, which illustrates a bi-functional molecule (M3) 400 attached to a metal layer 401 and a structural formula 403 of the bi-functional molecule (M3) 400. The bi-functional molecule (M3) 400 can be similar to or the same as the bi-functional molecule (M1) 211 described above in connection with at least FIGS. 1A-2. The metal layer 401 can be similar to or the same as the metal layer 201 described above in connection with at least FIGS. 1A-2. The bi-functional molecule (M3) 400 includes a moiety 405 comprising one or more molecules having light absorbing properties. The moiety 405 can be similar to or the same as one or more of the moieties described above in connection with at least FIGS. 1A-2.

For one embodiment, and as shown in FIG. 3, the moiety 405 comprises an aurone. For this embodiment, the moiety 405 can be functionalized at C6 and C5' locations to attach to a backbone of the bi-functional molecule (M3) 400. It is to be appreciated that the descriptions provided in connection with FIG. 3 can be applied to or combined with one or more of the descriptions provided in connection with one or more of FIG. 1A-2.

FIG. 4 illustrates a package substrate 500 formed in accordance with an embodiment. As shown, the package substrate 500 comprises a dielectric layer 501, which may be on a cored or coreless substrate. Also, the package substrate 500 comprises features 509 formed on the dielectric layer 501. For one embodiment, each of the features 509 comprises a metal feature 507 with an interfacial layer 505 formed thereon. The metal features 507 can, for example, be interconnects. The interfacial layer 505 can be similar to or the same as any of the interfacial layers described above in connection with one or more of FIGS. 1A-4.

Referring now to FIG. 5, a cross-sectional illustration of a packaged system 500 is shown, in accordance with an embodiment. For an embodiment, the packaged system 500 may include a semiconductor die 540 electrically coupled to a package substrate 570 with solder bumps 543. For additional embodiments, the semiconductor die 540 may be electrically coupled to the package substrate 570 with any suitable interconnect architecture, such as wire bonding or the like. The package substrate 570 may be electrically coupled to a board, such as a printed circuit board (PCB) 580, with solder bumps 573. For additional embodiments, the package substrate 570 may be electrically coupled to a board, such as the PCB 580, with any suitable interconnect architecture, such as wire bonding or the like.

For one embodiment, at least one of the features 510 comprises a metal feature (e.g., an interconnect, etc.) having an interfacial layer formed thereon. Embodiments of interfacial layers are described above in connection with one or more of FIGS. 1A-4. For an embodiment, one or more features 510 formed based on one or more of the embodiments described above may be integrated into: (i) the package substrate 570; (ii) the board 580; or (iii) the package substrate 570 and the board 580. Embodiments include any number of one or more features 510 formed into the package substrate 570 and/or the board 580. For example, a plurality of one or more interconnects 510 may be integrated—for signal communication or any other desired use—into: (i) the package substrate 570; (ii) the board 580; or (iii) the package substrate 570 and the board 580.

Figure 6:
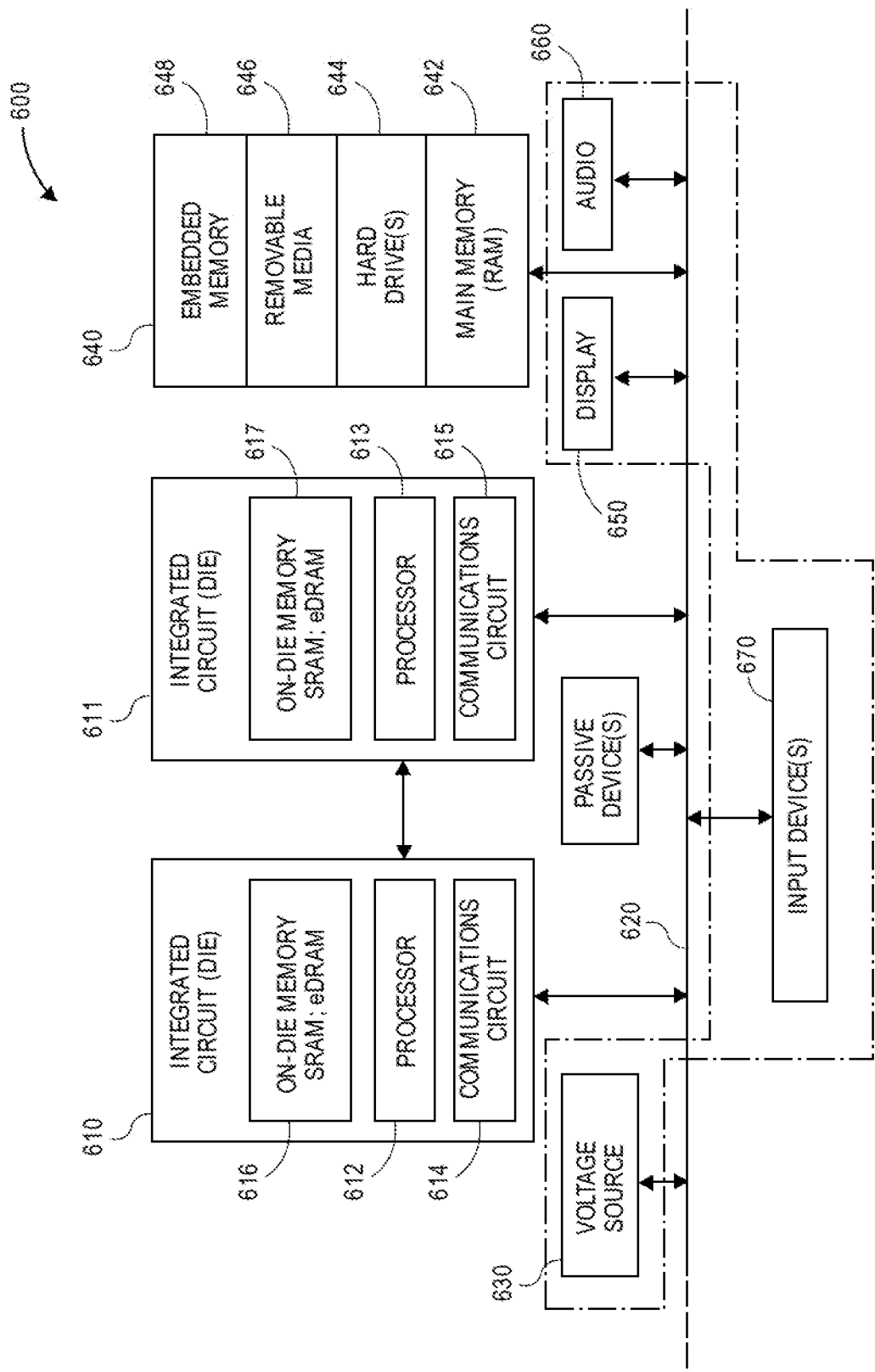
FIG. 6 is an illustration of a schematic block diagram of a computer system, according to an embodiment.

FIG. 6 illustrates a schematic of computer system 600 according to an embodiment. The computer system 600 (also referred to as an electronic system 600) can include interconnects having interfacial layers formed thereon in accord with any of the embodiments and their equivalents as set forth in this disclosure. The computer system 600 may be a mobile device, a netbook computer, a wireless smart phone, a desktop computer, a hand-held reader, a server system, a supercomputer, or a high-performance computing system.

The system 600 can be a computer system that includes a system bus 620 to electrically couple the various components of the electronic system 600. The system bus 620 is a single bus or any combination of busses according to various embodiments. The electronic system 600 includes a voltage source 630 that provides power to the integrated circuit 610. For one embodiment, the voltage source 630 supplies current to the integrated circuit 610 through the system bus 620.

The integrated circuit 610 is electrically coupled to the system bus 620 and includes any circuit, or combination of circuits according to an embodiment. For an embodiment, the integrated circuit 610 includes a processor 612. As used herein, the processor 612 may mean any type of circuit such as, but not limited to, a microprocessor, a microcontroller, a graphics processor, a digital signal processor, or another processor. For an embodiment, the processor 612 includes, or is coupled with, a semiconductor package comprising interconnects having interfacial layers formed thereon in accordance with any of the embodiments and their equivalents, as described in the foregoing specification. For an embodiment, SRAM embodiments are found in memory caches of the processor. Other types of circuits that can be included in the integrated circuit 610 are a custom circuit or an application-specific integrated circuit (ASIC), such as a communications circuit 614 for use in wireless devices such as cellular telephones, smart phones, pagers, portable computers, two-way radios, and similar electronic systems, or a communications circuit for servers. For an embodiment, the integrated circuit 610 includes on-die memory 616 such as static random-access memory (SRAM). For an embodiment, the integrated circuit 610 includes embedded on-die memory 616 such as embedded dynamic random-access memory (eDRAM). For one embodiment, the on-die memory 616 may be packaged with a process in accord with any of the embodiments and their equivalents, as described in the foregoing specification.

For an embodiment, the integrated circuit 610 is complemented with a subsequent integrated circuit 611. Useful embodiments include a dual processor 613 and a dual communications circuit 615 and dual on-die memory 617 such as SRAM. For an embodiment, the dual integrated circuit 610 includes embedded on-die memory 617 such as eDRAM.

For an embodiment, the electronic system 600 also includes an external memory 640 that in turn may include one or more memory elements suitable to the particular application, such as a main memory 642 in the form of RAM, one or more hard drives 644, and/or one or more drives that handle removable media 646, such as diskettes, compact disks (CDs), digital variable disks (DVDs), flash memory drives, and other removable media known in the art. The external memory 640 may also be embedded memory 648 such as the first die in a die stack, according to an embodiment.

For an embodiment, the electronic system 600 also includes a display device 650 and an audio output 660. For an embodiment, the electronic system 600 includes an input device such as a controller 670 that may be a keyboard, mouse, trackball, game controller, microphone, voice-recognition device, or any other input device that inputs information into the electronic system 600. For an embodiment, an input device 670 is a camera. For an embodiment, an input device 670 is a digital sound recorder. For an embodiment, an input device 670 is a camera and a digital sound recorder.

At least one of the integrated circuits 610 or 611 can be implemented in a number of different embodiments, including a semiconductor package comprising interconnects having interfacial layers formed thereon as described herein, an electronic system, a computer system, one or more methods of fabricating an integrated circuit, and one or more methods of fabricating an electronic assembly that includes interconnects having interfacial layers formed thereon, according to any disclosed embodiments set forth herein and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the semiconductor package comprising inductor features and a magnetic film in accordance with any of the disclosed embodiments as set forth herein and their art-recognized equivalents. A foundation substrate may be included, as represented by the dashed line of FIG. 6. Passive devices may also be included, as is also depicted in FIG. 6.

Reference throughout this specification to "one embodiment," "an embodiment," "another embodiment" and their variations means that a particular feature, structure, configuration, or characteristic described in connection with the embodiment is included in at least one embodiment. Thus, the appearances of the phrase "for one embodiment," "for an embodiment," "for another embodiment," "in one embodiment," "in an embodiment," "in another embodiment," or their variations in various places throughout this specification are not necessarily referring to the same embodiment. Furthermore, the particular features, structures, configurations, or characteristics may be combined in any suitable manner in one or more embodiments.

The terms "over," "to," "between," "onto," and "on" as used in the foregoing specification refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

The description provided above in connection with one or more embodiments as described herein that is included as part of a process of forming semiconductor packages may also be used for other types of IC packages and mixed logic-memory package stacks. In addition, the processing sequences may be compatible with both wafer level packages (WLP), and integration with surface mount substrates such as LGA, QFN, and ceramic substrates.

In the foregoing specification, abstract, and/or figures, numerous specific details are set forth, such as specific materials and processing operations, in order to provide a thorough understanding of embodiments described herein. It will, however, be evident that any of the embodiments described herein may be practiced without these specific details. In other instances, well-known features, such as the integrated circuitry of semi conductive dies, are not described in detail in order to not unnecessarily obscure embodiments described herein. Furthermore, it is to be understood that the various embodiments shown in the Figures and described in connection with the Figures are illustrative representations and are not necessarily drawn to scale. Thus, various modifications and/or changes may be made without departing form the broader spirit and scope of the embodiments described in connection with the foregoing specification, abstract, and/or Figures. As used herein, the phrases "A or B", "A and/or B", "one or more of A and B", and "at least one of A or B" means (A), (B), or (A and B).

Examples of interconnects include, but are not limited to, microstrip conductive lines and stripline conductive lines. Examples of microstrip conductive lines include, but are not limited to, regular microstrip conductive lines, edge-coupled microstrip conductive lines, and embedded microstrip conductive lines. Regular microstrip conductive lines are conductive lines that are routed on an external layer of a routing layer. Forming these types of microstrip conductive lines requires designing of a thickness and a width of a conductive line, a height of the package substrate, and a type of dielectric material used to form one or more layers of the routing layer. Edge-coupled microstrip conductive lines enable routing differential pairs. Forming these types of microstrip conductive lines includes the same requirements as those used to form regular microstrip conductive lines with an additional requirement to design a conductive line spacing for a differential pair. Embedded microstrip conductive lines are also similar to regular microstrip conductive lines except that there is another dielectric layer above the microstrip conductive lines. Stripline conductive lines are surrounded by dielectric material suspended between two ground planes on internal layers of a routing layer. Examples of stripline conductive lines include, but are not limited to, symmetric or regular stripline conductive lines, asymmetric stripline conductive lines, edge-coupled stripline conductive lines, and broadside-coupled stripline. Symmetric or regular stripline conductive lines are routed on internal layers (between two ground planes) of a routing layer. Forming these types of stripline conductive lines requires designing of a thickness and a width of a conductive line, a height of the package substrate, and a type of dielectric material used to form one or more layers of the routing layer based on a constraint that requires the conductive lines to be embedded between the two ground planes. Forming these types of stripline conductive lines includes the same requirements as those used to form symmetric stripline conductive lines with an additional requirement to account for any stripline conductive lines that are not balanced precisely between the two ground planes. Edge-Coupled stripline conductive lines are for routing internal layer differential pairs. Forming these types of stripline conductive lines includes the same requirements as those used to form symmetric stripline conductive lines with an additional requirement to design a conductive line spacing for the differential pair. Broadside-Coupled stripline conductive lines are for routing internal layer differential pairs, but instead of side by side, the pairs are stacked on top of each other. Forming these types of stripline conductive lines includes the same requirements as those used to form edge-coupled stripline conductive lines. Metallic materials, as used herein, may be formed from any suitable material that is electrically conductive and/or magnetically inductive. Metallic materials include, but are not limited to, copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum (Pt), or any combination thereof. Dielectric materials may be formed from any suitable material that is electrically insulative. Dielectric materials include, but are not limited to, Ajinomoto Build-up Film (ABF), liquid crystal polymer, benzocyclobutene (BCB), polyimide, prepreg (a weaved fiber network "preimpregnated" into an epoxy matrix), epoxy, epoxy laminate material (e.g., FR4, G10, G11, FR4, FR5, FR6, etc.), or any combination thereof.

Embodiments described herein include a method comprising: forming an interfacial layer having one or more light absorbing molecules on a metal layer, wherein the one or more light absorbing molecules comprise a moiety exhibiting light absorbing properties; and depositing a resist layer on the interfacial layer.

Additional embodiments described herein include a method, wherein the interfacial layer comprises an organic interfacial layer.

Additional embodiments described herein include a method, wherein the organic interfacial layer comprises a self-assembled monolayer (SAM).

Additional embodiments described herein include a method, wherein forming the interfacial layer on the metal layer, comprises: chemisorbing or physisorbing first molecules to a surface of the metal layer; and reacting second molecules with the first molecules, wherein a product of the reaction is the interfacial layer and wherein one or more of the first molecules and the second molecules comprises the moiety.

Additional embodiments described herein include a method, wherein the first molecules comprise a head group (R1) and a tail group (R2 or R3) and wherein the second molecules comprise a head group (R5) and a tail group (R4).

Additional embodiments described herein include a method, wherein a reaction comprising a first tail group (R2) of the first molecules as a reagent produces a second tail group (R3) of the first molecules.

Additional embodiments described herein include a method, wherein the moiety is attached, using one or more carbon atoms, to one or more of a backbone of the first molecules and a backbone of the second molecules.

Additional embodiments described herein include a method, wherein the moiety comprises one or more of: a flavonoid; an isoflavanoid; a neoflavanoid; and an aurone.

Embodiments described herein include a package substrate comprising: a metal layer; and an interfacial layer having one or more light absorbing molecules on the metal layer, wherein the one or more light absorbing molecules comprise a moiety exhibiting light absorbing properties.

Additional embodiments described herein include a package substrate, wherein the interfacial layer comprises an organic interfacial layer.

Additional embodiments described herein include a package substrate, wherein the organic interfacial layer comprises a self-assembled monolayer (SAM).

Additional embodiments described herein include a package substrate, wherein the interfacial layer on the metal layer, comprises: first molecules chemisorbed or physisorbed to a surface of the metal layer; and second molecules reacted with the first molecules, wherein a product of the reaction is the interfacial layer and wherein one or more of the first molecules and the second molecules comprises the moiety.

Additional embodiments described herein include a package substrate, wherein the first molecules comprise a head group (R1) and a tail group (R2 or R3) and wherein the second molecules comprise a head group (R5) and a tail group (R4).

Additional embodiments described herein include a package substrate, wherein a reaction comprising a first tail group (R2) of the first molecules as a reagent produces a second tail group (R3) of the first molecules.

Additional embodiments described herein include a package substrate, wherein the moiety is attached, using one or more carbon atoms, to one or more of a backbone of the first molecules and a backbone of the second molecules.

Additional embodiments described herein include a package substrate, wherein the moiety comprises one or more of: a flavonoid; an isoflavanoid; a neoflavanoid; and an aurone.

Embodiments described herein include a semiconductor package comprising: a dielectric layer; a metal layer on the dielectric layer; and an interfacial layer having one or more light absorbing molecules on the metal layer, wherein the one or more light absorbing molecules comprise a moiety exhibiting light absorbing properties.

Additional embodiments described herein include a semiconductor package, wherein the interfacial layer comprises an organic interfacial layer.

Additional embodiments described herein include a semiconductor package, wherein the organic interfacial layer comprises a self-assembled monolayer (SAM).

Additional embodiments described herein include a semiconductor package, wherein the interfacial layer on the metal layer, comprises: first molecules chemisorbed or physisorbed to a surface of the metal layer; and second molecules reacted with the first molecules, wherein a product of the reaction is the interfacial layer and wherein one or more of the first molecules and the second molecules comprises the moiety.

Additional embodiments described herein include a semiconductor package, wherein the first molecules comprise a head group (R1) and a tail group (R2 or R3) and wherein the second molecules comprise a head group (R5) and a tail group (R4).

Additional embodiments described herein include a semiconductor package, wherein a reaction comprising a first tail group (R2) of the first molecules as a reagent produces a second tail group (R3) of the first molecules.

Additional embodiments described herein include a semiconductor package, wherein the moiety is attached, using one or more carbon atoms, to one or more of a backbone of the first molecules and a backbone of the second molecules.

Embodiments described herein include a printed circuit board (PCB) comprising: a metal layer; and an interfacial layer having one or more light absorbing molecules on the metal layer, wherein the one or more light absorbing molecules comprise a moiety exhibiting light absorbing properties.

Additional embodiments described herein include a PCB, wherein the interfacial layer comprises an organic interfacial layer.

Additional embodiments described herein include a PCB, wherein the organic interfacial layer comprises a self-assembled monolayer (SAM).

Additional embodiments described herein include a PCB, wherein the interfacial layer on the metal layer, comprises: first molecules chemisorbed or physisorbed to a surface of the metal layer; and second molecules reacted with the first molecules, wherein a product of the reaction is the interfacial layer and wherein one or more of the first molecules and the second molecules comprises the moiety.

Additional embodiments described herein include a PCB, wherein the first molecules comprise a head group (R1) and a tail group (R2 or R3) and wherein the second molecules comprise a head group (R5) and a tail group (R4).

Additional embodiments described herein include a PCB, wherein a reaction comprising a first tail group (R2) of the first molecules as a reagent produces a second tail group (R3) of the first molecules.

Additional embodiments described herein include a PCB, wherein the moiety is attached, using one or more carbon atoms, to one or more of a backbone of the first molecules and a backbone of the second molecules.

Embodiments described herein include a method comprising: forming an interfacial layer having light absorbing properties on a metal layer, comprising: chemisorbing or physisorbing first molecules to a surface of the metal layer, the first molecules comprising a head group (R1) and a tail group (R2 or R3); and reacting second molecules with the first molecules, the second molecules comprising a head group (R5) and a tail group (R4), wherein a product of the reaction is the interfacial layer; and depositing a resist layer on the interfacial layer, wherein one or more of: the first molecules comprises a moiety (L1); and the second molecules comprises a moiety (L2).

Additional embodiments include a method, wherein one or more of the moiety (L1) and the moiety (L2) comprises a moiety exhibiting light absorbing properties.

Additional embodiments include a method, wherein the moiety exhibiting light absorbing properties comprises one or more of: a flavonoid; an isoflavanoid; a neoflavanoid; and an aurone.

Additional embodiments include a method, wherein the moiety exhibiting light absorbing properties is attached, using carbon atoms, to one or more of a backbone of the first molecules and a backbone of the second molecules.

Additional embodiments include a method, wherein the attachment is performed using a single or double point of attachment.

Additional embodiments include a method, wherein a reaction comprising a first tail group (R2) of the first molecules as a reagent produces a second tail group (R3) of the first molecules.

Additional embodiments include a method, further comprising performing a lithography technique that includes exposing the resist layer to a light source.

Additional embodiments include a method, wherein the lithography technique is a high resolution lithography technique and wherein the light source is a high intensity energy beam.

Additional embodiments include a method, wherein the interfacial layer comprises an organic interfacial layer.

Additional embodiments include a method, wherein the interfacial layer is in film form.

Additional embodiment include a method, wherein an organic interfacial layer includes, but is not limited to, a self-assembled monolayer (SAM), a construct and/or a variation of a SAM, an organic adhesion promotor moiety, and a non-adhesion promoter moiety.

Embodiments described herein include a package substrate comprising: a metal layer; an interfacial layer having light absorbing properties on the metal layer, the interfacial layer comprising: first molecules chemisorbed or physisorbed to a surface of the metal layer, the first molecules comprising a head group (R1) and a tail group (R2 or R3); and second molecules reacted with the first molecules, the second molecules comprising a head group (R5) and a tail group (R4), wherein a product of the reaction is the interfacial layer, wherein one or more of: the first molecules comprises a moiety (L1); and the second molecules comprises a moiety (L2).

Additional embodiments described herein include a package substrate, wherein one or more of the moiety (L1) and the moiety (L2) comprises a moiety exhibiting light absorbing properties.

Additional embodiments described herein include a package substrate, wherein the moiety exhibiting light absorbing properties comprises one or more of: a flavonoid; an isoflavanoid; a neoflavanoid; and an aurone.

Additional embodiments described herein include a package substrate, wherein the moiety exhibiting light absorbing properties is attached, using carbon atoms, to one or more of a backbone of the first molecules and a backbone of the second molecules.

Additional embodiments described herein include a package substrate, wherein the attachment is performed using a single or double point of attachment.

Additional embodiments described herein include a package substrate, wherein a reaction comprising a first tail group (R2) of the first molecules as a reagent produces a second tail group (R3) of the first molecules.

Additional embodiments described herein include a package substrate, wherein the metal layer is a smooth metal layer.

Additional embodiments described herein include a package substrate, wherein the metal layer is on a dielectric layer.

Embodiments described herein include a semiconductor package comprising: a dielectric layer; a metal layer on the dielectric layer; and an interfacial layer having light absorbing properties on the metal layer, the interfacial layer comprising: first molecules chemisorbed or physisorbed to a surface of the metal layer, the first molecules comprising a head group (R1) and a tail group (R2 or R3); and second molecules reacted with the first molecules, the second molecules comprising a head group (R5) and a tail group (R4), wherein a product of the reaction is the interfacial layer, wherein one or more of: the first molecules comprises a moiety (L1); and the second molecules comprises a moiety (L2).

Additional embodiments described herein include a semiconductor package, wherein one or more of the moiety (L1) and the moiety (L2) comprises a moiety exhibiting light absorbing properties.

Additional embodiments described herein include a semiconductor package, wherein the moiety exhibiting light absorbing properties comprises one or more of: a flavonoid; an isoflavanoid; a neoflavanoid; and an aurone.

Additional embodiments described herein include a semiconductor package, wherein the moiety exhibiting light absorbing properties is attached, using carbon atoms, to one or more of a backbone of the first molecules and a backbone of the second molecules.

Additional embodiments described herein include a semiconductor package, wherein the attachment is performed using a single or double point of attachment.

Additional embodiments described herein include a semiconductor package, wherein a reaction comprising a first tail group (R2) of the first molecules as a reagent produces a second tail group (R3) of the first molecules.

Additional embodiments described herein include a semiconductor package, wherein the metal layer is a smooth metal layer.

Embodiments described herein include a printed circuit board (PCB) comprising: a metal layer; and an interfacial layer having light absorbing properties on the metal layer, the interfacial layer comprising: first molecules chemisorbed or physisorbed to a surface of the metal layer, the first molecules comprising a head group (R1) and a tail group (R2 or R3); and second molecules reacted with the first molecules, the second molecules comprising a head group (R5) and a tail group (R4), wherein a product of the reaction is the interfacial layer, wherein one or more of: the first molecules comprises a moiety (L1); and the second molecules comprises a moiety (L2).

Additional embodiments described herein include a PCB, wherein one or more of the moiety (L1) and the moiety (L2) comprises a moiety exhibiting light absorbing properties.

Embodiments described herein include a method in accordance with one or more of the embodiments described above.

Embodiments described herein include a package substrate in accordance with one or more of the embodiments described above.

Embodiments described herein include a semiconductor package in accordance with one or more of the embodiments described above.

Embodiments described herein include a PCB in accordance with one or more of the embodiments described above.

The invention claimed is:

1. A package substrate comprising:
   a metal layer; and
   an interfacial layer having one or more light absorbing molecules on the metal layer, wherein the one or more light absorbing molecules comprise a moiety comprising an aurone, wherein the interfacial layer comprises an organic interfacial layer, and wherein the organic interfacial layer comprises a self-assembled monolayer (SAM).

2. The package substrate of claim 1, wherein the interfacial layer on the metal layer, comprises:
   first molecules chemisorbed or physisorbed to a surface of the metal layer; and
   second molecules reacted with the first molecules, wherein a product of the reaction is the interfacial layer and wherein one or more of the first molecules and the second molecules comprises the moiety.

3. The package substrate of claim 2, wherein the first molecules comprise a head group (R1) and a tail group (R2 or R3) and wherein the second molecules comprise a head group (R5) and a tail group (R4).

4. The package substrate of claim 3, wherein a reaction comprising a first tail group (R2) of the first molecules as a reagent produces a second tail group (R3) of the first molecules.

5. The package substrate of claim 2, wherein the moiety is attached, using one or more carbon atoms, to one or more of a backbone of the first molecules and a backbone of the second molecules.

6. A semiconductor package comprising:
   a dielectric layer;
   a metal layer on the dielectric layer; and
   an interfacial layer having one or more light absorbing molecules on the metal layer, wherein the one or more light absorbing molecules comprise a moiety comprising an aurone, wherein the interfacial layer comprises an organic interfacial layer, and wherein the organic interfacial layer comprises a self-assembled monolayer (SAM).

7. The semiconductor package of claim 6, wherein the interfacial layer on the metal layer, comprises:
   first molecules chemisorbed or physisorbed to a surface of the metal layer; and
   second molecules reacted with the first molecules, wherein a product of the reaction is the interfacial layer and wherein one or more of the first molecules and the second molecules comprises the moiety.

8. The semiconductor package of claim 7, wherein the first molecules comprise a head group (R1) and a tail group (R2 or R3) and wherein the second molecules comprise a head group (R5) and a tail group (R4).

9. The semiconductor package of claim 8, wherein a reaction comprising a first tail group (R2) of the first molecules as a reagent produces a second tail group (R3) of the first molecules.

10. The semiconductor package of claim 7, wherein the moiety is attached, using one or more carbon atoms, to one or more of a backbone of the first molecules and a backbone of the second molecules.

11. A printed circuit board (PCB) comprising:
a metal layer; and
an interfacial layer having one or more light absorbing molecules on the metal layer, wherein the one or more light absorbing molecules comprise a moiety comprising an aurone.

12. The PCB of claim 11, wherein the interfacial layer comprises an organic interfacial layer.

\* \* \* \* \*